United States Patent
Lee et al.

(10) Patent No.: US 8,482,077 B2
(45) Date of Patent: Jul. 9, 2013

(54) SEMICONDUCTOR DEVICES AND METHODS FOR FABRICATING THE SAME

(75) Inventors: Jongho Lee, Hwaseong-si (KR); Chang-Bong Oh, Seongnam-si (KR); Ho Lee, Cheonan-si (KR); Myungsun Kim, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/102,860

(22) Filed: May 6, 2011

(65) Prior Publication Data

US 2011/0272736 A1 Nov. 10, 2011

(30) Foreign Application Priority Data

May 7, 2010 (KR) ........................ 10-2010-0043074

(51) Int. Cl.
*H01L 29/78* (2006.01)
(52) U.S. Cl.
USPC ..... 257/369; 257/396; 257/411; 257/E29.255
(58) Field of Classification Search
USPC ................... 257/368, 369, 396, 411, E29.255
See application file for complete search history.

(56) References Cited

U.S. PATENT DOCUMENTS

| 7,776,711 | B2* | 8/2010 | Kim | 438/424 |
| 7,989,896 | B2* | 8/2011 | Aoyama et al. | 257/379 |
| 2005/0205948 | A1* | 9/2005 | Rotondaro et al. | 257/411 |
| 2006/0170407 | A1* | 8/2006 | Messager | 323/313 |
| 2007/0102767 | A1* | 5/2007 | Cho et al. | 257/368 |
| 2009/0068807 | A1 | 3/2009 | Karve et al. | |
| 2009/0140344 | A1* | 6/2009 | Azuma | 257/368 |
| 2009/0221118 | A1* | 9/2009 | Chen et al. | 438/275 |
| 2010/0258876 | A1* | 10/2010 | Miyake et al. | 257/368 |

FOREIGN PATENT DOCUMENTS

| JP | 2004-33556 | 11/2004 |
| JP | 2004-335566 | 11/2004 |
| KR | 10-0507377 | 8/2005 |
| KR | 10-0809327 | 2/2008 |

OTHER PUBLICATIONS

English Abstract for Publication No. 2004-33556, Nov. 25, 2004.
English Abstract for Publication No. 10-2005-0046054 (for 10-0507377), Aug. 1, 2005.
English Abstract for Publication No. 10-2008-0014307 (for 10-0809327), Feb. 14, 2008.
English Abstract for publication No. 2004-335566, Nov. 25, 2004.

* cited by examiner

*Primary Examiner* — Tuan N. Quach
(74) *Attorney, Agent, or Firm* — Muir Patent Consulting, PLLC

(57) ABSTRACT

A semiconductor device includes a substrate including a first region and a second region each having an n-type region and a p-type region, wherein the n-type region in the first region includes a silicon channel, the p-type region in the first region includes a silicon germanium channel, and the n-type region and the p-type region in the second region respectively include a silicon channel. A first gate insulating pattern formed of a thermal oxide layer is disposed on the substrate of the n-type and p-type regions in the second region.

25 Claims, 13 Drawing Sheets

SEMICONDUCTOR DEVICES AND METHODS FOR FABRICATING THE SAME

CROSS-REFERENCE TO RELATED APPLICATIONS

This U.S. non-provisional patent application claims priority under 35 U.S.C. §119 from Korean Patent Application No. 10-2010-0043074, filed on May 7, 2010, the contents of which are herein incorporated by reference in their entirety.

BACKGROUND

The present disclosure is directed to semiconductor devices and methods for fabricating the same, and more particularly, to semiconductor devices including input/output transistors with improved reliability and methods for fabricating the same.

With each succeeding generation of integrated circuits, device dimensions are reduced to provide higher degrees of integration and improved performance. In particular, a driving current of an electric device such as a MOS transistor may increase as a gate insulating layer thickness is minimized. Thus, the gate insulating layer may be formed to have fewer defects as well as better reliability for improving device performance.

A thermal oxide layer such as a silicon oxide layer has been previously used as the gate insulating layer, because a thermal silicon oxide layer has a stable interface with a silicon substrate and can be easily formed.

Since silicon oxide has a low dielectric constant of about 3.9, there are limitations to reducing its thickness, as reducing the thickness of a silicon oxide layer can cause a leakage current through the silicon oxide layer used as a gate insulating layer.

Other mono metal oxide layers, such as a hafnium oxide layer and a zirconium oxide layer, other metal silicates, such as hafnium silicate and zirconium silicate, and other aluminates, such as hafnium aluminum oxide, can provide improved device performance even if the layers are thicker than a silicon oxide layer, thus high-k dielectric materials have been considered for use as a gate insulating layer.

SUMMARY

Embodiments of the inventive concept provide semiconductor devices having input/output transistors with improved GOI (Gate Oxide Integrity).

Embodiments of the inventive concept also provide methods for fabricating semiconductor devices having input/output transistors with improved GOI.

Embodiments of the inventive concept provide semiconductor devices, including: a substrate including a first region and a second region, each including at least one n-type region and at least one p-type region, wherein the n-type region in the first region includes a silicon channel, the p-type region in the first region includes a silicon germanium channel, and the n-type region and the p-type region in the second region each include a silicon channel; and a first gate insulating pattern formed of a thermal oxide disposed on the substrate of the n-type and p-type regions in the second region; and a gate electrode disposed on the second gate insulating pattern.

In some embodiments, the semiconductor devices may further include a second insulating pattern disposed on the first gate insulating pattern and a surface of the substrate of the n-type and p-type regions in the first region.

In other embodiments, the second gate insulating pattern may include silicon oxide or a high-k dielectric material.

In still other embodiments, when the second gate insulating pattern includes the high-k dielectric material, the semiconductor devices may include a buffer pattern disposed between the second gate insulating pattern and the substrate of the n-type and p-type regions in the first region, and between the second gate insulating pattern and the first gate insulating pattern in the second region.

In yet other embodiments, the gate electrode may be a metal gate.

In further embodiments, the silicon germanium channel of the p-type region in the first region may be disposed in the substrate.

Embodiments of the inventive concept provide methods for fabricating semiconductor devices, including: forming a plurality of device isolation patterns on a substrate to define n-type regions and p-type regions in a first region, and n-type regions and p-type regions in a second region; forming a first gate insulating layer from a thermal oxide on the substrate that exposes the p-type region in the first region; selectively forming a silicon germanium channel at the substrate of the p-type region in the first region; and selectively removing the first gate insulating layer from the n-type region in the first region.

In some embodiments, the methods may further include forming a second gate insulating layer on the surface of the substrate, including the first gate insulating layer on the second region; and forming a gate electrode layer on the second gate insulating layer.

In other embodiments, the second gate insulating layer may include silicon oxide or a high-k dielectric material.

In still other embodiments, if the second gate insulating layer includes the high-k dielectric material, the methods may further include: forming a buffer layer on the surface of the substrate, including the first gate insulating layer on the second region, before forming the second gate insulating layer.

In yet other embodiments, the methods may include patterning the gate electrode layer, the second gate insulating layer and the first gate insulating layer to respectively form gate electrodes on the n-type and p-type regions in the first region, and on the n-type and p-type regions in the second region.

In further embodiments, forming the first gate insulating layer may include forming a first gate insulating layer on the surface of the substrate; forming a first photoresist pattern on the first gate insulating layer that exposes the p-type region in the first region; selectively removing the first gate insulating layer from the p-type region in the first region by an etching process using the first photoresist pattern as an etching mask; and removing the first photoresist pattern.

In still further embodiments, the methods may include, before forming the first photoresist pattern: forming a silicon nitride layer on the first gate insulating layer; and forming a capping oxide layer on the silicon nitride layer.

In even further embodiments, selectively removing the first gate insulating layer from the p-type region in the first region may include: removing the capping oxide layer and the silicon nitride layer from the p-type region in the first region by an etching process using the first photoresist pattern as an etching mask; removing the first photoresist pattern; and selectively removing the first gate insulating layer from the p-type region in the first region while entirely removing the capping oxide layer.

In yet further embodiments, selectively removing the first gate insulating layer from the n-type region in the first region may include: forming a sacrificial oxide layer on the surface of the substrate; forming a second photoresist pattern on the sacrificial oxide layer that exposes the n-type region in the first region; and selectively removing the first gate insulating layer from the n-type region in the first region by an etching process using the second photoresist pattern as an etching mask.

In yet further embodiments, selectively removing the first gate insulating layer from the n-type region in the first region may include: removing the sacrificial layer from the n-type region in the first region by an etching process using the second photoresist pattern as an etching mask; removing the second photoresist pattern; selectively removing the silicon nitride layer from the n-type region in the first region; and selectively removing the first gate insulating layer from the n-type region in the first region while entirely removing the sacrificial oxide layer.

In yet further embodiments, the methods may include: removing the silicon nitride layer from the first gate insulating layer in the second region.

Embodiments of the inventive concept provide semiconductor devices, including: a substrate including a first region and a second region, each region including a plurality of n-type regions and a plurality of p-type regions; silicon channels formed in the substrate of the n-type regions in the first region and in the n-type regions and the p-type regions in the second region; a silicon germanium channel formed in the substrate of the p-type regions in the first region; and a first gate insulating pattern disposed on the substrate of the n-type and p-type regions in the second region.

In some embodiments, the first gate insulating pattern is formed of a thermal oxide.

In some embodiments, the semiconductor devices may include device isolation patterns that separate the n-type regions and the p-type regions.

DETAILED DESCRIPTION OF EXEMPLARY EMBODIMENTS

Exemplary embodiments of the inventive concept will be described below in more detail with reference to the accompanying drawings. Embodiments of the inventive concept may, however, be embodied in different forms and should not be construed as limited to exemplary embodiments set forth herein.

Hereinafter, exemplary embodiments of the inventive concept will be described in detail with reference to the accompanying drawings.

Figure 1:
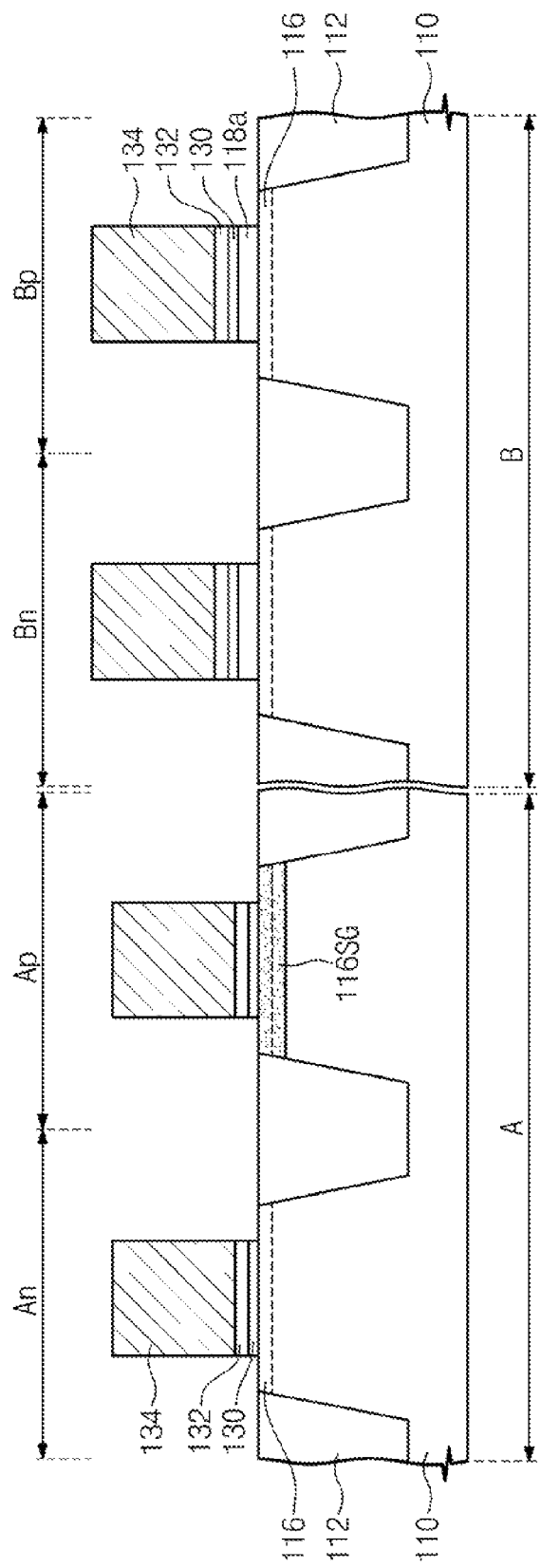
FIG. 1 is a cross-sectional view illustrating a semiconductor device according to an embodiment of the inventive concept.

FIG. 1 is a cross-sectional view illustrating a semiconductor device according to an embodiment of the inventive concept.

Referring to FIG. 1, a semiconductor device includes a substrate 110 having a first region A and a second region B. The first region A may be a region having a thin gate insulating pattern and the second region B may be a region having a thick insulating pattern. In other words, a low voltage transistor may be disposed in the first region A, and a high voltage transistor may be disposed in the second region B. According to an embodiment of the inventive concept, input/output transistors may be disposed in the second region B. The first region A may include at least one n-type region An and at least one p-type region Ap, and the second region B may include at least one n-type region Bn and at least one p-type region Bp. A NMOS transistor may be formed in the n-type regions An and Bn, and a PMOS transistor may be formed in the p-type regions Ap and Bp.

The n-type and p-type regions of the first region A and the n-type and p-type regions of the second region B may be defined by device isolation patterns 112. The substrate 110 may be a silicon substrate.

A silicon channel 116 may be formed in the n-type regions An, a silicon germanium channel 116SG may be formed in the p-type regions Ap, and a silicon channel 116 may be foamed in each of the n-type and p-type regions Bn and Bp. The silicon germanium channel 116SG may be formed in or on the substrate 110. For example, the silicon germanium channel 116SG may be formed in the substrate 110 to a predetermined depth from a surface of the substrate 110.

The silicon germanium channel 116SG in the p-type regions Ap may improve carrier mobility of the PMOS transistor, thus lowering a threshold voltage $V_{th}$. The threshold voltage characteristic of the PMOS transistor can be improved because the silicon germanium channel 116SG has a conductive band offset which is lower by about 30 mV than that of the silicon channel 116, and a valence band offset which is lower by about 230 mV than that of the silicon channel 116.

A first gate insulating patterns 118a may be formed from a thermal oxide on the surface of the substrate 110 of the n-type and p-type regions Bn and Bp. If silicon oxide intended for use as a gate insulating layer is formed directly on the silicon germanium channel 116SG, reliability of the gate insulating layer may be compromised. In addition, an oxide layer formed by thermal oxidation is superior to an oxide layer formed by chemical vapor deposition. Thus, the first gate insulating pattern 118a may include a wet thermal oxide or a dry thermal oxide.

A second gate insulating pattern 132 may be disposed on the first gate insulating pattern 118a at the n-type and p-type regions Bn and Bp as well as the surface of the substrate 110 of the n-type and p-type regions An and Ap. The second gate insulating pattern 132 may include silicon oxide or a high-k dielectric material. The high-k dielectric material refers to a material with a dielectric constant greater than that of silicon oxide, and generally the dielectric constant of the high-k dielectric material is greater than 10. For example, oxides, aluminates or silicates including at least one of hafnium, zirconium, aluminum, titanium, lanthanum, yttrium, gadolinium and tantalum may be used as the high-k dielectric layer. The second gate insulating pattern 132 with the high-k dielectric material may be formed into a mono layered structure or a multi layered structure.

If the second insulating pattern 132 includes a high-k dielectric material, buffer layer patterns 130 may be disposed between the second gate insulating pattern 132 and the first gate insulating pattern 118 in the second region B, and between the second gate insulating pattern 132 and the substrate 110 of the n-type and p-type regions An and Ap in the first region A. The buffer layer pattern 130 may include silicon oxide or silicon oxynitride. The buffer layer pattern 130 may improve interface quality between the substrate 110 and the second gate insulating pattern 132 and between the first gate insulating pattern 118a and the second gate insulating pattern 132. As a result, carrier mobility can be improved.

Gate electrodes 134 may be disposed on the second gate insulating pattern 132. The gate electrodes 134 may be metal gates.

Thus, the buffer layer pattern 130, the second gate insulating pattern 132 and the gate electrodes 134 may be sequentially stacked on the substrate 110 in the first region A to form gate patterns. The first gate insulating pattern 118a, the buffer layer pattern 130, the second gate insulating pattern 132 and the gate electrodes 134 may be sequentially stacked on the substrate 110 in the second region B to form gate patterns.

Source/drain regions (not shown) may be disposed in the substrate 110 at both sides of the gate patterns.

According to an embodiment of the inventive concept, the thicker gate insulating pattern in the second region includes a thermal oxide layer which is in contact with the silicon channel, but not the silicon germanium channel. Thus, the transistor with a thinner gate insulating pattern can be improved with regard to its operation speed as well as its gate oxide integrity (GOI). Therefore, a semiconductor device can be provided with high performance transistors that reduce a GIDL (Gate Induced Drain Leakage) current, improving the reliability of the transistors.

FIGS. 2 through 10 are cross-sectional views illustrating a method for fabricating a semiconductor device according to an embodiment of the inventive concept.

Figure 2:
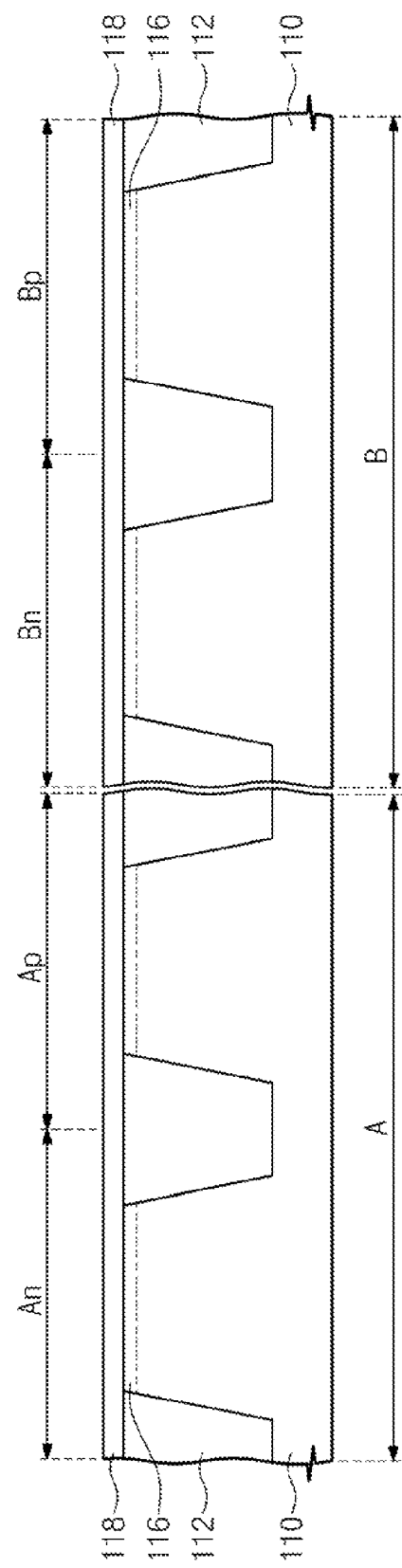
FIGS. 2 through 10 are cross-sectional views illustrating a method for fabricating a semiconductor device according to an embodiment of the inventive concept.

Referring to FIG. 2, a plurality of device isolation patterns 112 may be formed in a substrate 110 to define n-type and p-type regions An and Ap in a first region A of the substrate 110 as well as n-type and p-type regions Bn and Bp in a second region B of the substrate 110. The device isolation patterns 112 may include silicon oxide. The first region A may be a region where a thinner gate insulating layer is formed, and the second region may be a region where a thicker gate insulating layer is formed. In other words, the first region A may be a region for a low voltage transistor and the second region B may be a region for a high voltage transistor. Input/output transistors may be formed in the second region B.

Each of the first and second regions A and B may include n-type regions An, Bn and p-type regions Ap, Bp. An NMOS transistor may be formed in the n-type regions An and Bn and a PMOS transistor may be formed in the p-type regions An and Bn.

The substrate 110 may be a silicon substrate, and silicon channels 116 of a predetermined depth from the surface of the substrate 110 may be formed in both the n-type regions An and Bn and p-type regions Ap and Bp.

A first gate insulating layer 118 is formed on the surface of the substrate 110. The first gate insulating layer 118 may be formed as a thermal oxide by a wet thermal oxidation process or a dry thermal oxidation process, since silicon oxide layers formed by thermal oxidation are superior to those foamed by chemical vapor deposition.

A pad oxide layer (not shown) may be removed before forming the first gate insulating layer 118. After forming the first gate insulating layer 118, a nitrifying and annealing process may be performed on the first gate insulating layer 118.

Figure 3:
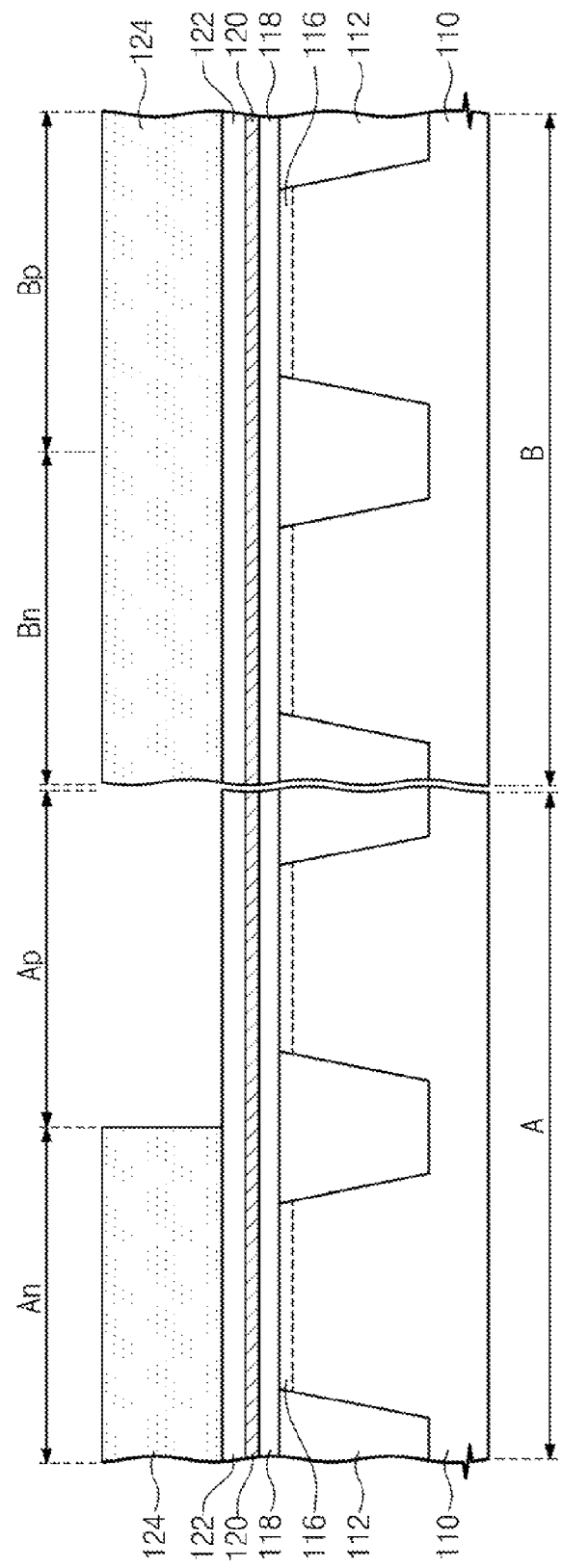

Referring to FIG. 3, a silicon nitride layer 120 and a capping oxide layer 122 are formed sequentially on the first gate insulating layer 118, and a first photoresist pattern 124 may be formed that exposes the p-type region Ap of the first region A.

The silicon nitride layer 120 may be used as a mask or an etch stop layer in a subsequent process for forming a silicon germanium channel 116SG (shown in FIG. 5) in the p-type region Ap. The silicon nitride layer 120 may be formed by molecular layer deposition (MLD), a low pressure CVD (LPCVD), atomic layer deposition (ALD) or a pulsed CVD. The silicon nitride layer 120 may be formed to have a thickness of about 1 to about 10 nm.

The capping oxide layer 122 may be formed by low temperature deposition of an oxide (LTO).

Figure 4:
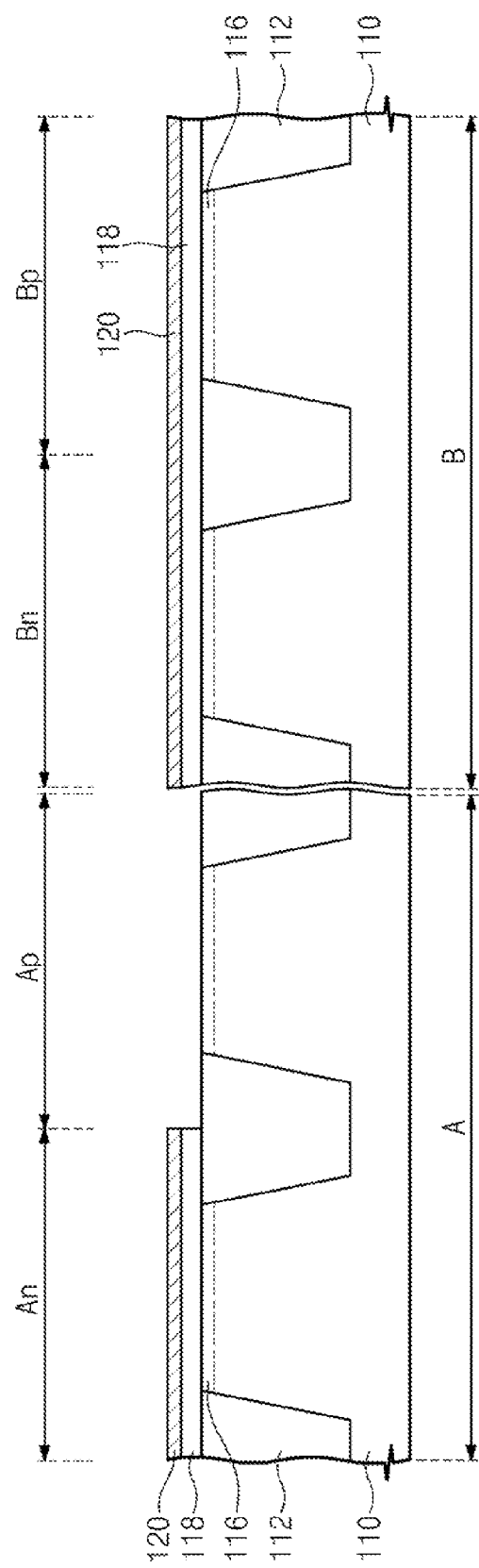

Referring to FIG. 4, the capping oxide layer 122 and the silicon nitride layer 120 are successively removed from the p-type region Ap by an etching process using the first photoresist pattern 124 as a mask layer. The etching process may be a reactive ion etching (RIE) process.

After the etching process is complete, the first photoresist pattern 124 is removed. The first gate insulating layer 118 may be selectively etched from the p-type region Ap while fully etching the capping oxide layer 122. In this case, the first gate insulating layer 118 and the capping layer 122 may be etched by a wet etching process. The silicon nitride layer 120 may be used as an etch stop layer in the wet etching process. Thus, the first gate insulating layer 118 can be selectively removed from the p-type region Ap.

Figure 5:
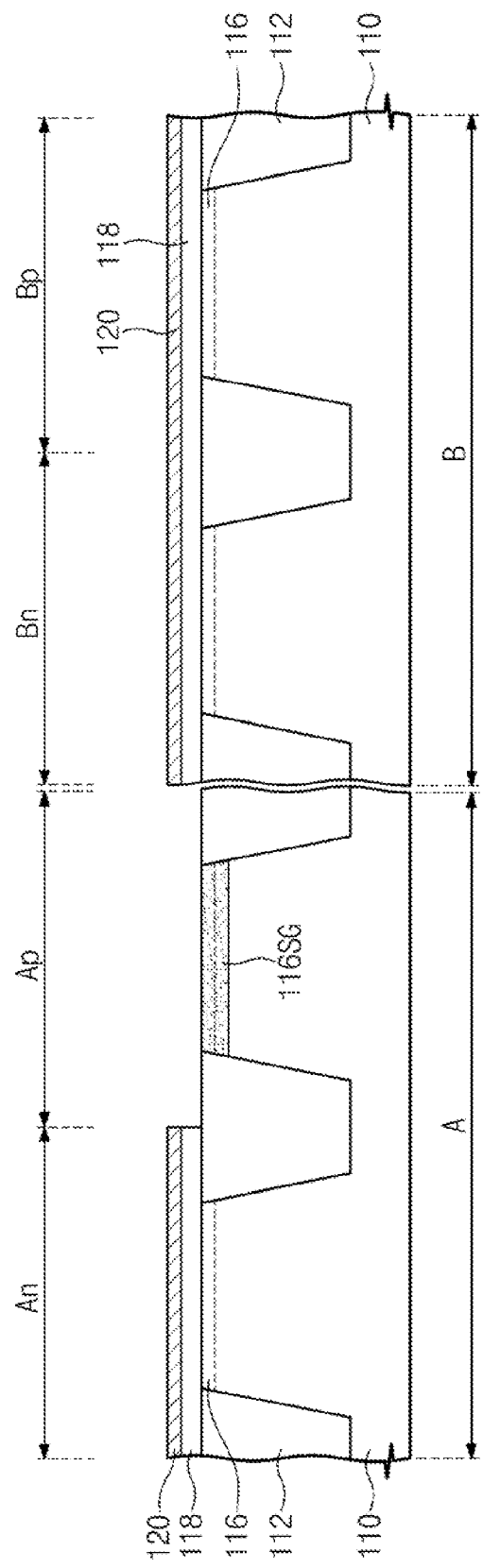

Referring to FIG. 5, a silicon germanium channel 116SG is selectively formed in the substrate 110 of the p-type region Ap. The silicon germanium channel 116SG may be formed either in the substrate 110 or on the substrate 110. The silicon germanium channel 116SG may be formed in the substrate 110 to a predetermined depth from the surface of the substrate 110. The forming of the silicon germanium channel 116SG may include growing a silicon germanium epitaxial layer or injecting germanium ions. For example, germanium ions may be injected into the substrate 110 to form the silicon germanium channel 116SG.

The silicon germanium channel 116SG formed in the p-type region Ap can improve carrier mobility and lower the threshold voltage, because the conductive band offset of the silicon germanium channel 116SG is about 30 mV lower than that of the silicon channel 116, and the valance band offset of the silicon germanium channel 116SG is about 230 mV lower than that of the silicon channel 116. Thus, the PMOS transistor can have improved threshold voltage characteristics.

Figure 6:
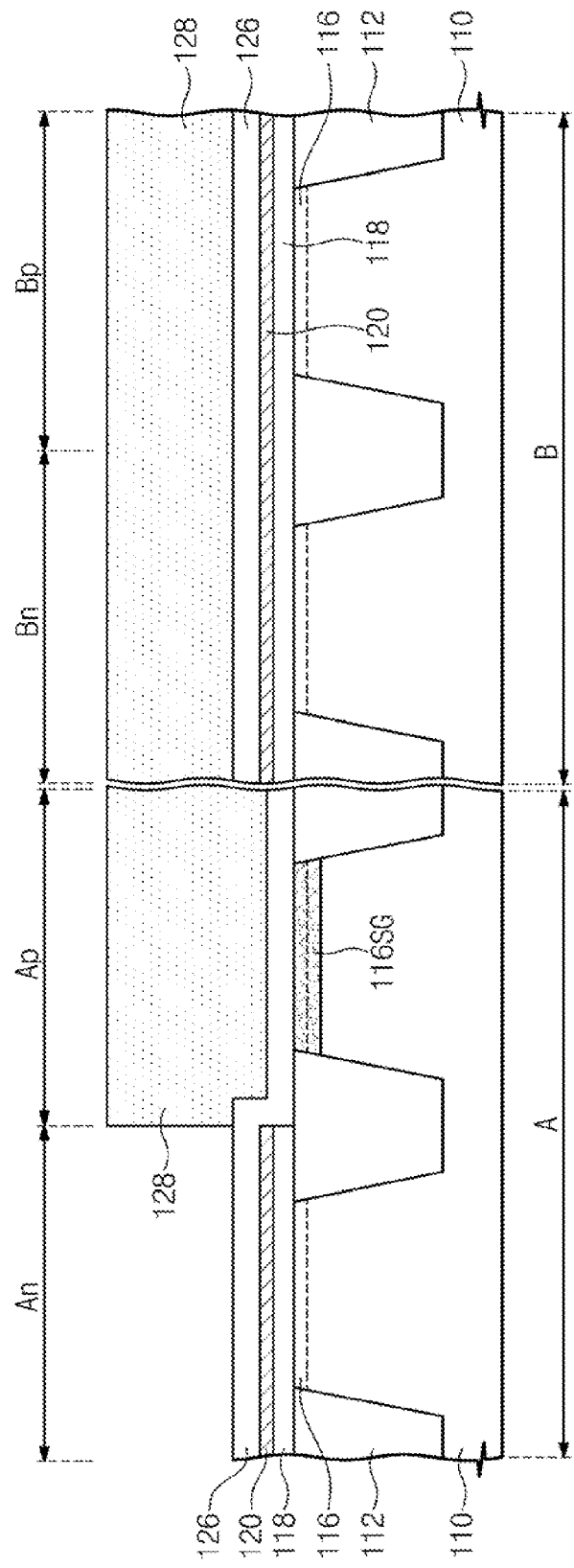

Referring to FIG. 6, after forming the silicon germanium channel 116SG, a sacrificial oxide layer 126 may be formed on the surface of the substrate 110. Subsequently, a second photoresist pattern 128 may be formed that exposes the n-type region An. The sacrificial oxide layer 126 may include silicon oxide.

Figure 7:
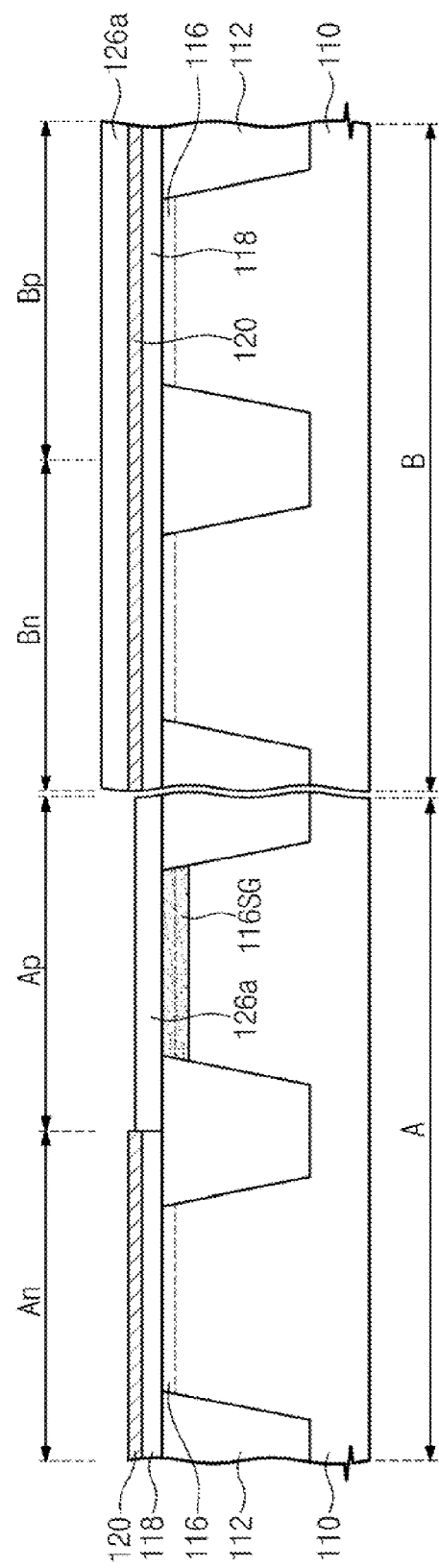
Figure 8:
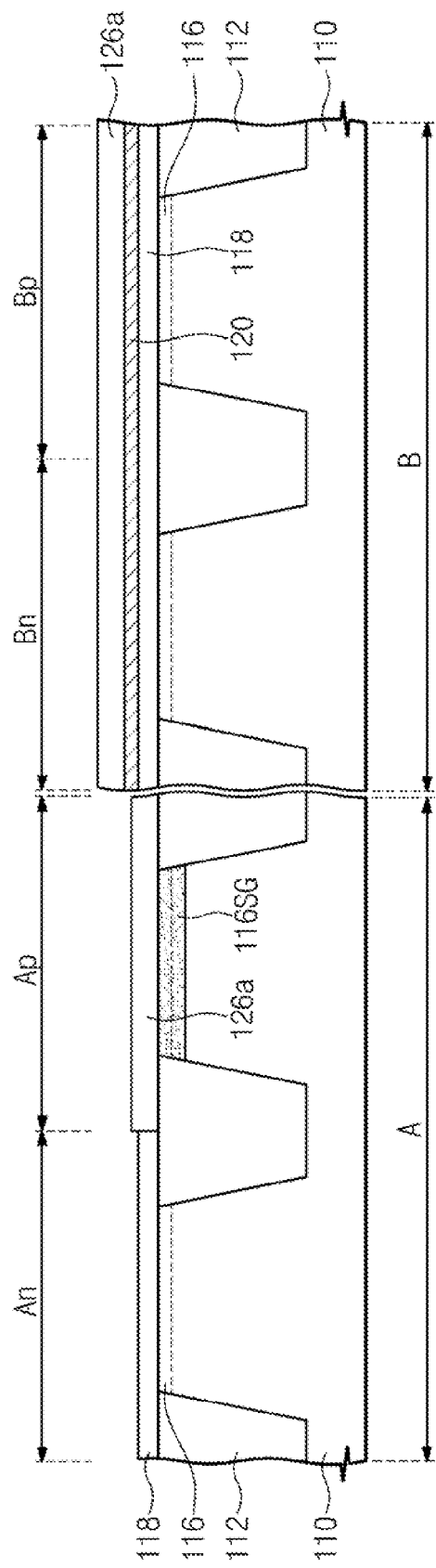

Referring to FIGS. 7 and 8, after removing the sacrificial oxide layer 126 from the n-type region An by an etching process using the second photoresist pattern 128 as an etch mask, the second photoresist pattern 128 is removed. The silicon nitride layer 120 disposed on the n-type region An is also removed.

Alternatively, the sacrificial oxide layer 126 and the silicon nitride layer 120 disposed on the n-type region An may be successively etched by an etching process using the second photoresist pattern 128 as an etch mask, after which the second photoresist pattern 128 is removed.

Figure 9:
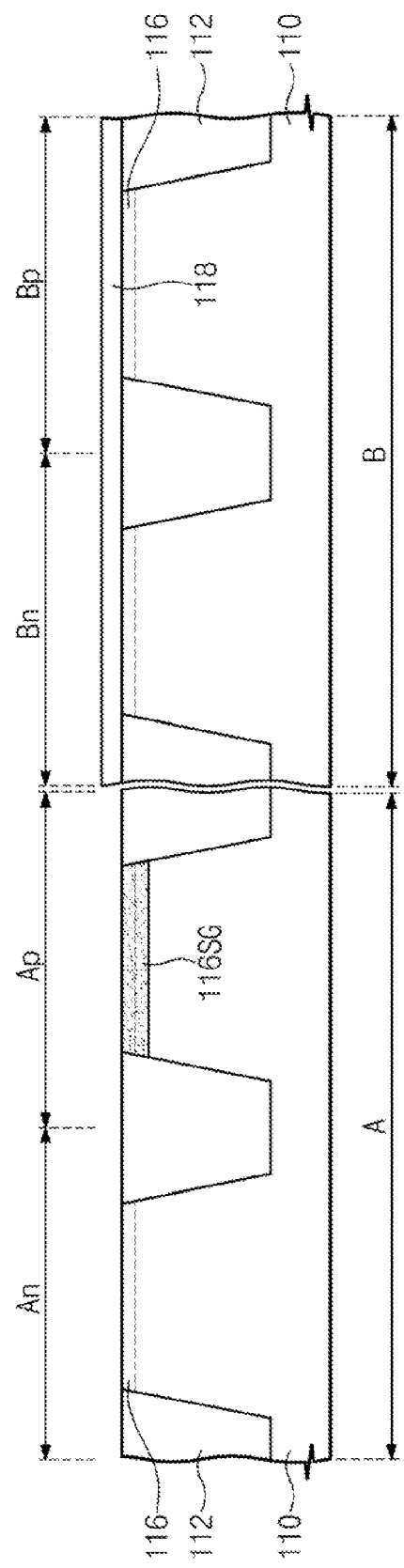

Referring to FIG. 9, the first gate insulating layer 118 may be removed from the n-type region An while fully removing the sacrificial oxide layer 126. Subsequently, the silicon nitride layer 120 is removed from the first gate insulating layer 118 in the second region B. The silicon nitride layer 120 may be used as an etch stop layer during the process of removing the sacrificial oxide layer 126 and the first gate insulating layer 118 from the n-type region An. Therefore, the first gate insulating layer 118 can be selectively removed from the n-type region An.

As a result, the first gate insulating layer 118 can be removed from the first region A, which includes the silicon germanium channel 116SG, but left behind on the second region B, which includes the silicon channels 116 but not the silicon germanium channel 116SG. Thus, silicon oxide is not formed directly on the germanium channel 116SG, improving reliability of the gate insulating layer.

Figure 10:
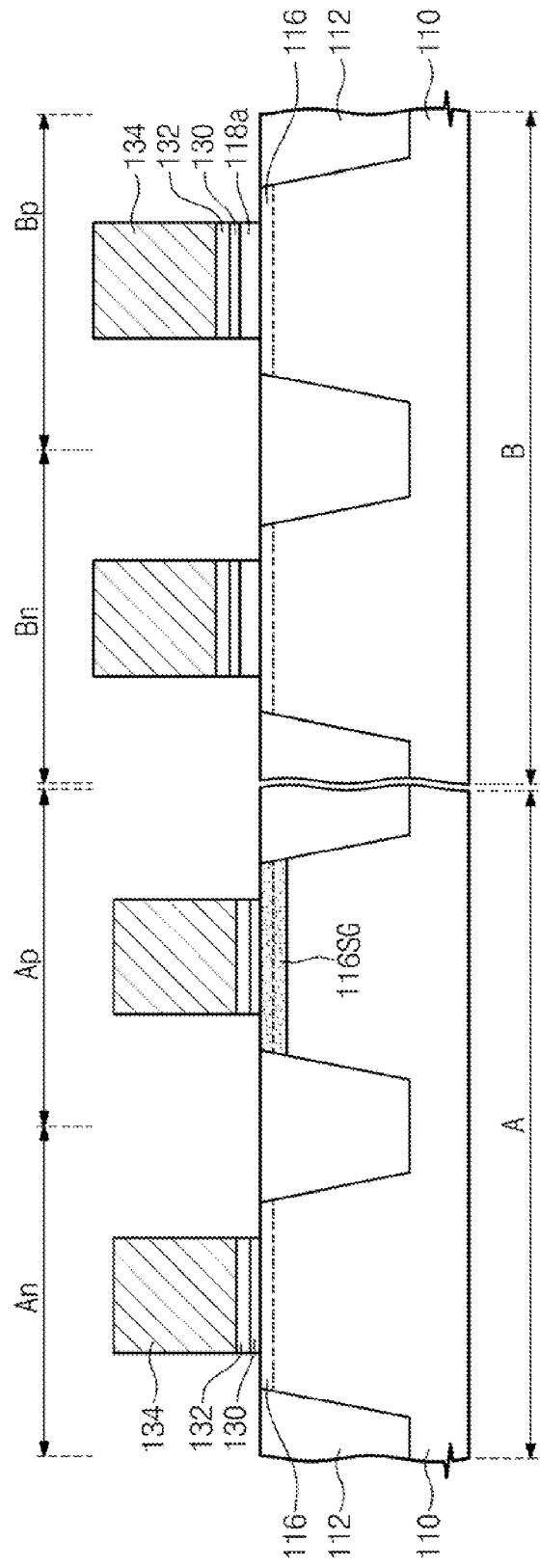

Referring to FIG. 10, a second gate insulating layer (not shown) and a gate electrode layer (not shown) are formed on the surface of the substrate 110, including the first gate insulating layer 118 in the second region B, after which the gate electrode layer, the second gate insulating layer or/and the first gate insulating layer 118 are patterned to form gate patterns on the n-type and p-type regions An, Bn, Ap and Bp.

The second gate insulating layer may include silicon oxide or a high-k dielectric material. For example, the second gate insulating layer may be a high-k dielectric material having a dielectric constant greater than that of silicon oxide. In general, the dielectric constant of the high-k dielectric material is greater than 10. For example, oxides, aluminates or silicates including at least one of hafnium, zirconium, aluminum, titanium, lanthanum, yttrium, gadolinium and tantalum may be used as the high-k dielectric layer. A second gate insulating pattern 132 using the high-k dielectric material may be formed into a mono layered structure or a multi layered structure. The gate electrode layer may include metal.

If the second gate insulating layer includes a high-k dielectric layer, a buffer layer may be formed on the surface of the substrate 110, including the first gate insulating layer 118 on the second region B, before forming the second gate insulating layer. The buffer layer may include silicon oxide or silicon oxynitride. The buffer layer may be formed to improve interface quality between the substrate and the second gate insulating layer and between the first gate insulating layer 118 and the second gate insulating layer, improving carrier mobility.

A buffer layer pattern 130, the second gate insulating pattern 132 and a gate electrode 134 may be sequentially stacked to form gate patterns in the first region A. The first gate insulating pattern 118a, the buffer layer pattern 130, the second gate insulating pattern 132 and the gate electrode 134 may be sequentially stacked to form gate patterns in the second region B. Therefore, a low voltage NMOS transistor may be formed in the n-type region An, a low voltage PMOS transistor may be formed in the p-type region Ap, a high voltage NMOS transistor may be formed in the n-type region Bn, and a high voltage PMOS transistor may be formed in the p-type region Bp.

According to an embodiment of the inventive concept, the thicker gate insulating pattern in the second region B includes a thermal oxide layer in contact with the silicon channels, but not the silicon germanium channels. Thus, the transistor with a thinner gate insulating pattern can have improved operation speed and GOI characteristics. Therefore, a semiconductor device can be provided with high performance transistors with reduced GIDL currents and improved reliability.

Figure 11:
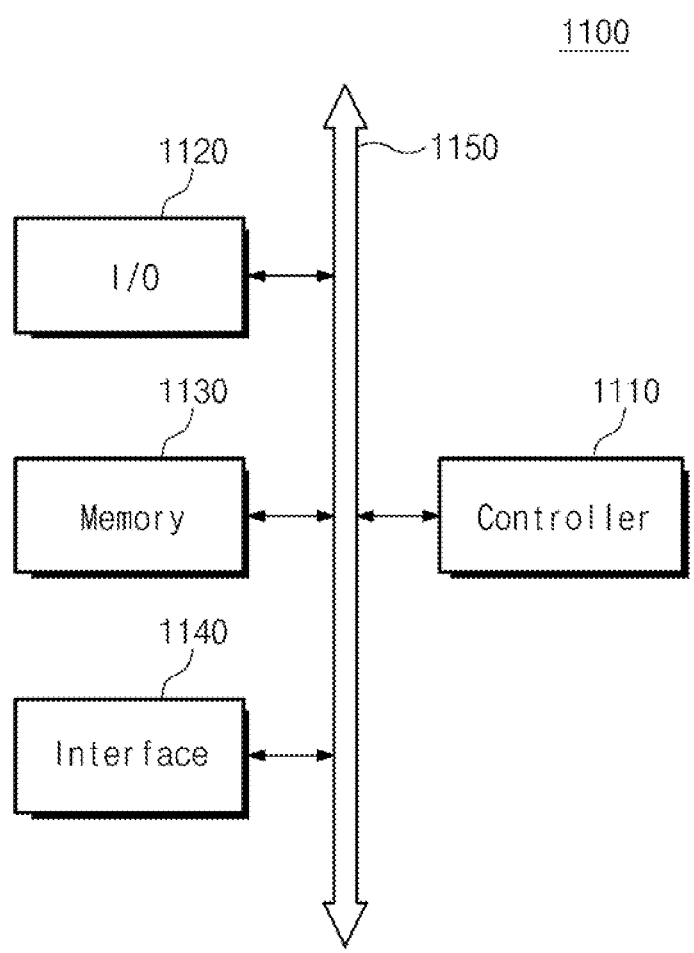
FIG. 11 is a schematic block diagram illustrating a memory system including a semiconductor device according to an embodiment of the inventive concept.

FIG. 11 is a schematic block diagram illustrating a memory system including a semiconductor device according to an embodiment of the inventive concept.

Referring to FIG. 11, a memory system 1100 can be used in a PDA, a portable computer, a web tablet, a wireless phone, a mobile phone, a digital music player, a memory card, and other devices for transmitting and/or receiving data in a wireless environment.

The memory system 1100 may include a controller 1110, an input/output device 1120 such as a keypad, keyboard, and a display device, a memory 1130, an interface 1140, and a bus 1150. The memory 1130 and the interface 1140 may interface with each other through the bus 1150.

The controller 1110 may include at least one of a micro processor, a digital signal processor, a micro controller and other processing devices. The memory 1130 may be used to store commands to be executed by the controller. The input/output device 1120 may receive data or signals from an external source to the memory system 1100 or transmit data or signals to the external source. For example, the input/output device 1120 may include a keyboard, a keypad, or a display device.

The memory 1130 may include a nonvolatile memory device according to an embodiment of the inventive concept. The memory 1130 may also include other sorts of memory, such as a random access memory.

The interface 1140 may also transmit data to a communication network or receive data from the network.

Figure 12:
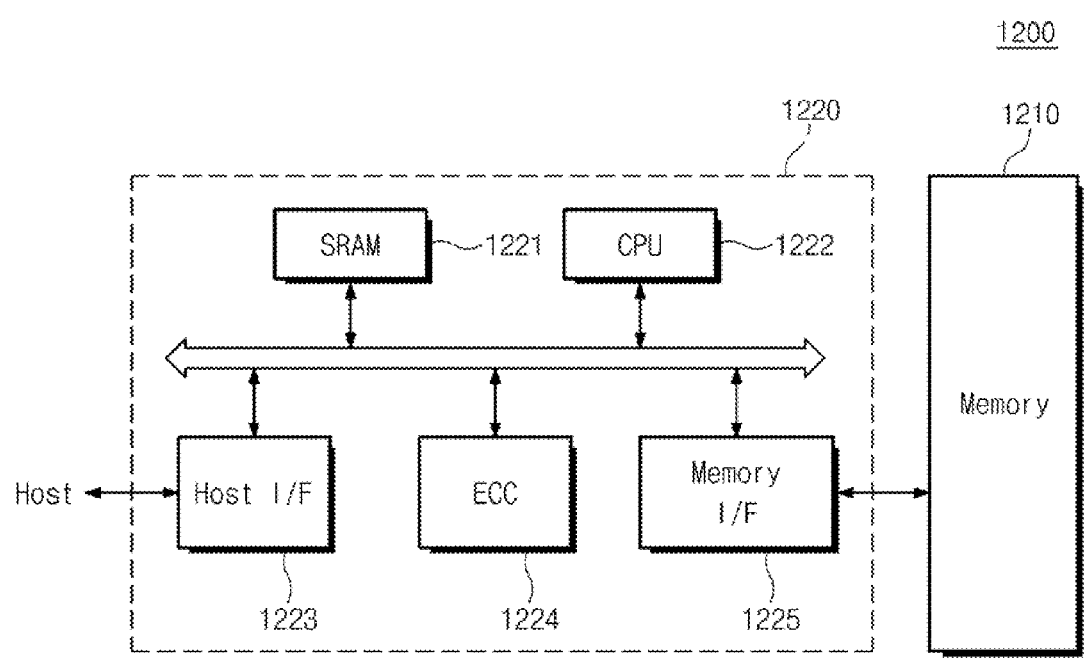
FIG. 12 is a schematic block diagram illustrating a memory card including a semiconductor device according to an embodiment of the inventive concept.

FIG. 12 is a schematic block diagram illustrating a memory card having a semiconductor device according to an embodiment of the inventive concept.

Referring to FIG. 12, a memory card 1200 for mass data storage has a memory device 1210 having a semiconductor device according to an embodiment of the inventive concept. The memory card 1200 may include a memory controller 1220 which controls a data interchange between a host and the memory device 1210.

An SRAM 1221 may be used as a driving memory for a processing unit 1222. A host interface 1223 may implement a data interchange protocol of a host connected with the memory card 1200. An error collection code block 1224 may detect and collect errors included in data from the memory device 1210. A memory interface 1225 may interface with the memory device 1210. The processing unit 1222 may perform control operations for interchanging data with the memory controller 1220. The memory card 1200 may further include a ROM (Read Only Memory) according to embodiments of the inventive concept. The ROM may store code data for interfacing with the host.

According to a semiconductor device, a memory card and a memory device according to embodiments of the inventive concept, a highly integrated memory system can be provided. In particular, a semiconductor device according to embodiments of the inventive concept may employ a memory system such as a solid state disk.

Figure 13:
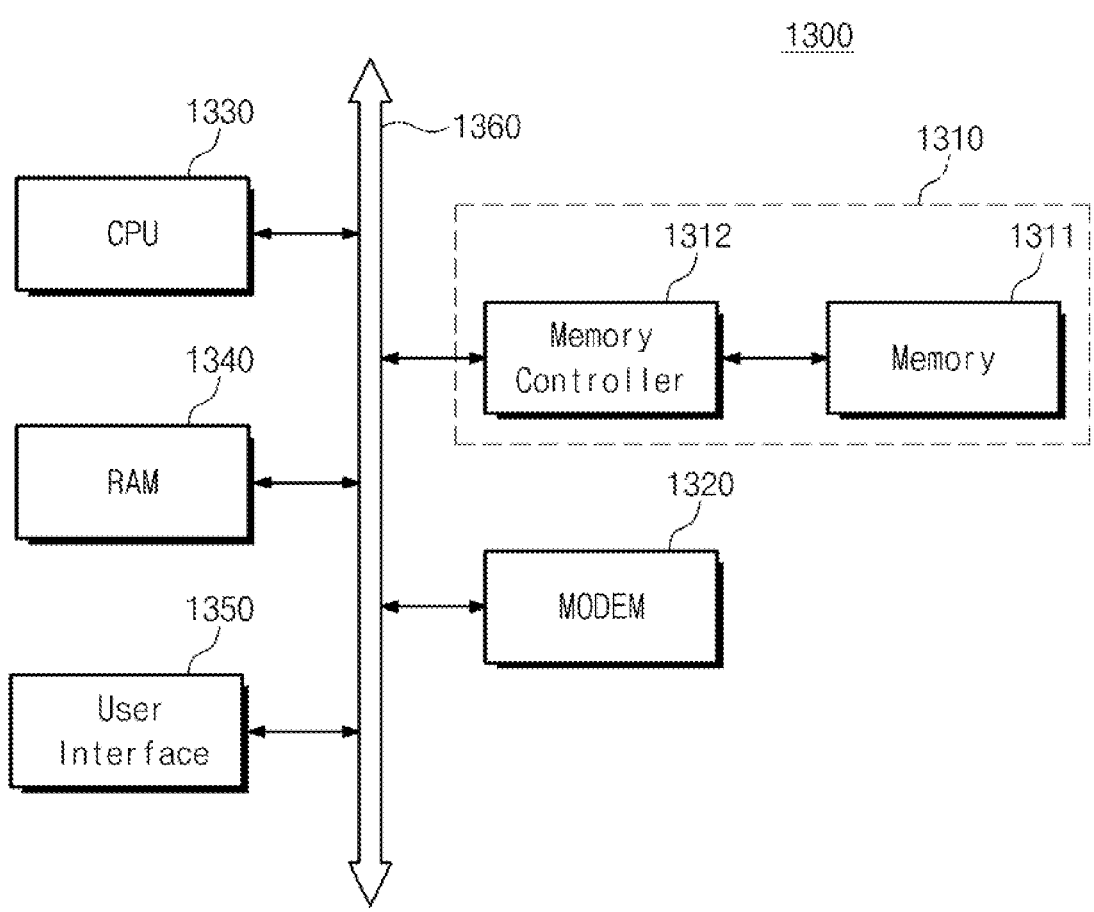
FIG. 13 a schematic block diagram illustrating an information processing system having a semiconductor device according to an embodiment of the inventive concept.

FIG. 13 is a schematic block diagram illustrating an information processing system having a semiconductor device according to an embodiment of the inventive concept.

Referring to FIG. 13, a memory system 1310, which includes a semiconductor device 1311 according to an embodiment of the inventive concept and a memory controller 1312 for exchanging data between the semiconductor device 1311 and a system bus 1360, may be embedded in an information processing system 1300 such as a mobile appliance or a desktop computer. The information processing system 1300 may include the memory system 1310, and a modem 1320, a CPU 1330, a RAM 1340 and a user interface 1350 that are electrically connected with the system bus 1360. The memory system 1310 may be the same as the memory system of FIG. 11. The memory system 1310 may store data processed by the CPU 1330 or received from an external source. The memory system may be a solid state disk (SSD)

such that the information processing system 1300 can store mass data in the memory system 1310. The memory system 1310 can reduce error collection due to improved reliability. Therefore, the information processing system 1300 can perform high speed data interchange functions. The information processing system 1300 may have an application chipset, a camera imaging processor and input/output devices.

A memory device or a memory system according to embodiments of the inventive concept may be formed into a variety of packages. For example, the nonvolatile memory system can be mounted as a PoP (Package on Package), a BGA (Ball grid array), a CSP (Chip Scale Package), a PDIP (Plastic Dual In-line Package), a Die in Waffle Pack, a Die in Wafer Form, a COB (Chip On Board), a CERDIP (Ceramic Dual In-line Package), a MQFP (Plastic Metric Quad Flat Pack), a TQFP (Thin Quad Flat Pack), an SOIC(Small Outline), an SSOP (Shrink Small Outline Package), a TSOP (Thin Small Outline Package), a TQFP (Thin Quad Flat Pack), an SIP (System In Package), an MCP (Multi Chip Package), a WFP (Wafer-level Fabricated Package), or a WSP (Wafer-level Processed Stack Package) etc.

According to embodiments of the inventive concept, the gate insulating layer of the input/output transistor includes a thermal oxide layer in contact with the silicon channel but not the silicon germanium channel. The GOI affects the TDDB (Time Dependent Dielectric Breakdown) characteristics and the HCI (Hot Carrier Injection) characteristics. According to an embodiment of the inventive concept, the GOI of the input/output transistor can be improved, and a GIDL current can be reduced, to improve reliability of a semiconductor device having the input/output transistor.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device, comprising:
   a substrate including a first region and a second region, each region including at least one n-type region and at least one p-type region, wherein the n-type region in the first region includes a silicon channel, the p-type region in the first region includes a silicon germanium channel, and the n-type region and the p-type region in the second region each include a silicon channel;
   a first gate insulating pattern formed of a thermal oxide disposed on the substrate of the n-type and p-type regions in the second region; and
   a second gate insulating pattern disposed on the first gate insulating pattern and a surface of the substrate of the n-type and p-type regions in the first region.

2. The semiconductor device of claim 1, further comprising:
   a gate electrode disposed on the second gate insulating pattern.

3. The semiconductor device of claim 2, wherein the second gate insulating pattern comprises silicon oxide or a high-k dielectric material.

4. The semiconductor device of claim 3, further comprising, when the second gate insulating pattern comprises the high-k dielectric material:
   a buffer pattern disposed between the second gate insulating pattern and the substrate of the n-type and p-type regions in the first region, and between the second gate insulating pattern and the first gate insulating pattern in the second region.

5. The semiconductor device of claim 2, wherein the gate electrode is a metal gate.

6. The semiconductor device of claim 1, wherein the silicon germanium channel of the p-type region in the first region is disposed in the substrate.

7. A semiconductor device, comprising:
   a substrate including a first region and a second region, each region including a plurality of n-type regions and a plurality of p-type regions;
   silicon channels formed in the substrate of the n-type regions in the first region and in the n-type regions and the p-type regions in the second region;
   a silicon germanium channel formed in the substrate of the p-type regions in the first region;
   a first gate insulating pattern disposed on the substrate of the n-type and p-type regions in the second region; and
   a second gate insulating pattern disposed on the first gate insulating pattern and on the substrate of the n-type and p-type regions in the first region.

8. The semiconductor device of claim 7, wherein the first gate insulating pattern is formed of a thermal oxide.

9. The semiconductor device of claim 7, further comprising device isolation patterns that separate the n-type regions and the p-type regions.

10. A semiconductor device, comprising:
    a substrate including a first region and a second region;
    a low voltage transistor formed on the first region, the low voltage transistor including a silicon germanium channel, a first portion of a gate insulating layer having a dielectric constant greater than a silicon oxide and a buffer layer portion formed between the gate insulating layer and the silicon germanium channel; and
    a high voltage transistor formed on the second region, the high voltage transistor including a second portion of the gate insulating layer and a thermal oxide formed between the gate insulating layer and the substrate,
    wherein the gate insulating layer is a high-k dielectric.

11. The semiconductor device of claim 10, wherein the high voltage transistor comprises an input/output transistor.

12. The semiconductor device of claim 10, wherein the gate insulating layer has a dielectric constant is greater than 10.

13. A semiconductor device comprising:
    a substrate including a first n-type portion and a first p-type portion at a first region and a second n-type portion and a second p-type portion at a second region, wherein the first n-type portion in the first region includes a silicon channel, the first p-type portion in the first region includes a silicon germanium channel, and the second n-type portion in the second region includes a silicon channel;
    a first gate insulating pattern comprising a thermal oxide disposed on the second n-type portion and the second p-type portion in the second region of the substrate, the thermal oxide being in contact with the second n-type portion and the second p-type portion in the second region of the substrate;
    a second gate insulating pattern disposed on the first gate insulating pattern in the second region and on the first n-type portion and the first p-type portion in the first region of the substrate, the second gate insulating pattern comprising a high-k dielectric;

a first transistor comprising a first gate electrode on the second gate insulating pattern on the first n-type portion in the first region;

a second transistor comprising a second gate electrode on the second gate insulating pattern on the first p-type portion in the first region;

a third transistor comprising a third gate electrode on the second gate insulating pattern on the second n-type portion in the second region; and a fourth transistor comprising a fourth gate electrode on the second gate insulating pattern on the second p-type portion in the second region.

14. The semiconductor device of claim 13, further comprising a buffer insulating pattern disposed between the second gate insulating pattern and the first n-type and the first p-type portions in the first region of the substrate.

15. The semiconductor device of claim 14, wherein the buffer insulating pattern is in contact with the first n-type and the first p-type portions in the first region of the substrate.

16. The semiconductor device of claim 15, wherein the buffer insulating pattern comprises silicon oxide.

17. The semiconductor device of claim 15, wherein the buffer insulating pattern comprises silicon oxynitride.

18. The semiconductor device of claim 15, wherein the buffer insulating pattern is disposed between the first gate insulating pattern and the second gate insulating pattern in the second region of the substrate.

19. The semiconductor device of claim 18, wherein the buffer insulating pattern is in contact with the first gate insulating pattern in the second region of the substrate.

20. The semiconductor device of claim 18, wherein a bottom surface of the first gate electrode is a first distance above the substrate and a bottom surface of the third gate electrode is a second distance above the substrate, wherein the second distance is greater than the first distance.

21. The semiconductor device of claim 20, wherein the thermal oxide is not disposed in the first region.

22. The semiconductor device of claim 18, wherein the high-k dielectric has a dielectric constant greater than 10.

23. The semiconductor device of claim 13, wherein a bottom surface of the first gate electrode is a first distance above the substrate and a bottom surface of the third gate electrode is a second distance above the substrate, wherein the second distance is greater than the first distance.

24. The semiconductor device of claim 13, wherein the thermal oxide is not disposed in the first region.

25. The semiconductor device of claim 13, wherein the high-k dielectric has a dielectric constant greater than 10.

* * * * *